United States Patent
Lung et al.

(10) Patent No.: US 7,251,167 B2
(45) Date of Patent: Jul. 31, 2007

(54) METHOD FOR PROGRAMMING MULTI-LEVEL NITRIDE READ-ONLY MEMORY CELLS

(75) Inventors: Hsiang-Lan Lung, Hsinchu (TW); Chao-I Wu, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 129 days.

(21) Appl. No.: 11/026,947

(22) Filed: Dec. 29, 2004

(65) Prior Publication Data

US 2006/0141709 A1    Jun. 29, 2006

(51) Int. Cl.
*G11C 16/04* (2006.01)

(52) U.S. Cl. .............. 365/185.24; 365/185.03

(58) Field of Classification Search ........... 365/185.03, 365/185.22, 185.24

See application file for complete search history.

(56) References Cited

U.S. PATENT DOCUMENTS

| | | | |
|---|---|---|---|
| 6,219,276 B1 | 4/2001 | Parker | |
| 6,292,394 B1 | 9/2001 | Cohen et al. | |
| 6,552,387 B1 | 4/2003 | Eitan | |
| 6,829,172 B2* | 12/2004 | Bloom et al. | 365/185.22 |
| 6,967,872 B2* | 11/2005 | Quader et al. | 365/185.22 |
| 7,002,843 B2* | 2/2006 | Guterman et al. | 365/185.03 |

* cited by examiner

*Primary Examiner*—David Lam
(74) *Attorney, Agent, or Firm*—Stout, Uxa, Buyan & Mullins, LLP

(57) ABSTRACT

A method of programming data regions in a nitride read-only memory cell is described. In an erased state, the nitride read-only memory cell exhibits a low $V_t$ value. A data region that is to be programmed to a highest $V_t$ value is programmed first. Remaining data regions in the nitride read-only memory cell are programmed in a time order according to their descending $V_t$ values. For a nitride read-only memory cell that, in an erased state, exhibits a high $V_t$ value, a data region that is to be programmed to a lowest $V_t$ value is programmed first with remaining data regions programmed in a time order according to their ascending $V_t$ values.

17 Claims, 8 Drawing Sheets

METHOD FOR PROGRAMMING MULTI-LEVEL NITRIDE READ-ONLY MEMORY CELLS

CROSS-REFERENCE TO RELATED APPLICATIONS

This application is related to co-pending U.S. application Ser. No. 11/043,854, filed Jan. 25, 2005 and entitled METHOD OF DYNAMICALLY CONTROLLING PROGRAM VERIFY LEVELS IN MULTILEVEL MEMORY CELLS, which is commonly assigned and the contents of which are expressly incorporated herein by reference.

BACKGROUND OF THE INVENTION

1. Field of the Invention

The present invention relates generally to semiconductor memory programming methods and, more particularly, to methods for programming multi-level nitride read-only memory cells.

2. Description of Related Art

Non-volatile semiconductor memory devices are designed to maintain programmed information even in the absence of electrical power. Non-volatile memories in common use today include read-only memories (ROMs) that typically are programmed to store a fixed bit pattern at the time of manufacture and that subsequently can not be reprogrammed. Programmable read-only memories (PROMs) are a form of field-programmable memory devices that can be programmed once by a PROM programmer. Erasable programmable read-only memories (EPROMs) are programmable like PROMs, but can also be erased, for example, by exposure to ultraviolet light that places all bits in the memory to a known state (e.g., a logic 1). Electrically erasable programmable read-only memories (EEPROMs) are similar to EPROMs except that individual stored bits may be erased electrically. A particular form of EEPROMs, known as flash memories, typically is erased in blocks, although flash memory cells can be programmed individually.

Nitride read-only memory (NROM) devices represent a relatively recent development in non-volatile memory technology. (The acronym "NROM" is a part of a combination trademark of Saifun Semiconductors Ltd. of Netanya, Israel.) These devices store information in the form of localized trapped charges. Some nitride read-only memory devices are capable of storing multiple bits per cell. According to a typical implementation, charge can be stored in two regions of a nitride layer that forms part of a typical nitride read-only memory cell. Further, a multiple-bit nitride read-only memory cell may be formed of a single transistor, leading to densities of nitride read-only memory arrays that are higher than those achieved by many other forms of non-volatile memories.

A non-volatile memory device, for example, a nitride read-only memory cell, normally is programmed by applying programming voltages to terminals of the device. The programming voltages have the effect of injecting charge into a charge-trapping layer of the nitride read-only memory device, thereby modifying a threshold voltage, $V_t$. Some nitride read-only memory devices have two data regions in the charge-trapping layer that are able to store independent data values by modifying the $V_t$ in a localized area near a source or drain of a nitride read-only memory cell. When the $V_t$ is able to take on two distinguishable values, then each data region is capable of storing one bit of information.

Some coupling inevitably may exist between two regions in a nitride read-only memory cell. As a result, programming one data region can have an effect on the programming of the other data region in the same cell, a phenomenon that has been referred to as a second-bit effect. The second-bit effect can act to reduce the utility of nitride read-only memory device architectures.

A need thus exists in the prior art to provide a method of programming nitride read-only memory cells that may mitigate the effect of the undesirable second-bit effect.

SUMMARY OF THE INVENTION

The present invention addresses these needs by providing a method of programming a memory cell, such as a charge-trapping memory cell, which may take the form of a nitride read-only memory cell, wherein the second-bit effect is reduced. The invention herein disclosed can comprise a method including a step of providing a memory cell having a plurality of data regions, each data region being programmable to one of a plurality of program values, followed by a step of obtaining a program verify (PV) level according to the program value for each of a plurality of the data regions. A collection of PV and data region associations (or pairs) is thereby defined. The method continues with creating a ranking of the plurality of associations of the collection according to the PV levels of the plurality of associations. Subsequently, at least one of the data regions is programmed according to the ranking.

In accordance with another aspect, the invention can comprise a method of providing a nitride read-only memory cell that has a plurality of data regions with each data region being programmable to one of a plurality of values of a threshold voltage, $V_t$. According to a representative embodiment of this method, a nitride read-only memory cell is provided with two data regions, each data region being programmable to one of four $V_t$ values. A PV level for each data region is received according to a $V_t$ value, and a collection of (PV, data region) pairs may be defined. The (PV, data region) pairs may then be ranked according to the PV level for each pair in the collection, and the data regions may be programmed in a time order according to the ranking.

The present invention further comprises providing a nitride read-only memory cell having a source, a drain, a gate, and plurality of data regions, each data region being programmable to one of a plurality of $V_t$ values. An exemplary embodiment of the nitride read-only memory cell in an erased state exhibits a relatively low $V_t$ condition when in an erased state. A data region in this embodiment of the nitride read-only memory cell may be programmed by applying potentials to the source, drain, and gate that cause channel hot electrons to be injected into the data region. Another illustrative embodiment of the nitride read-only memory cell in an erased state exhibits a relatively high $V_t$ condition when in an erased state. A data region in this illustrative embodiment of the nitride read-only memory cell may be programmed by applying potentials to the source, drain, and gate that cause band-to-band hot holes to be injected into the data region.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1:
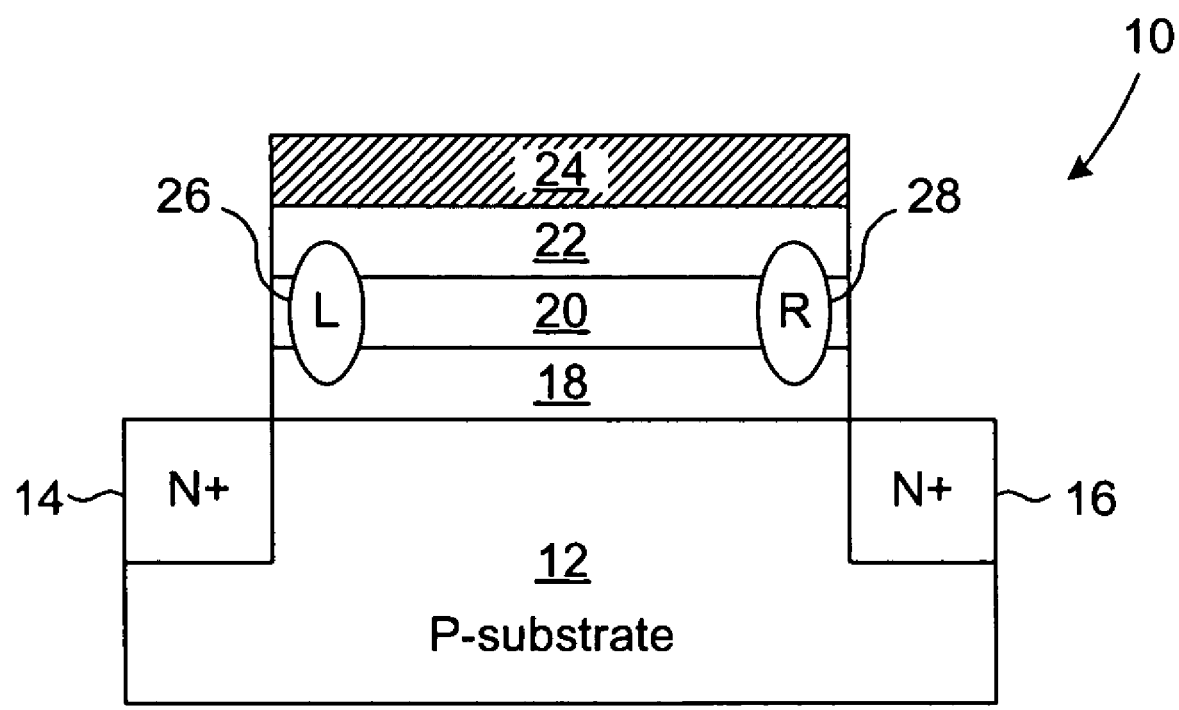
FIG. 1 is a cross-sectional diagram of a nitride read-only memory cell.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the programming or erasing of nitride read-only memory cells. The present invention may be practiced in conjunction with various integrated circuit operating methods that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to methods of programming a nitride read-only memory cell.

Referring more particularly to the drawings, FIG. 1 is a cross-sectional diagram of a memory cell, such as a non-volatile charge-trapping memory cell. As presently embodied, the non-volatile charge-trapping memory cell comprises a nitride read-only memory cell 10. The nitride read-only memory cell 10 is formed in a P-type substrate 12 in which may be formed N+ diffusion regions that function as a source 14 and a drain 16. In operation, a channel may form in the substrate 12 between the source 14 and the drain 16. The illustrated embodiment further comprises a first oxide layer 18 formed above the channel. A silicon nitride layer 20 overlies the first oxide layer 18, a second oxide layer 22 overlies the silicon nitride layer 20, and a gate 24 overlies the second oxide layer 22. The first and second oxide layers 18 and 22 may be formed of silicon dioxide, and the gate 24 may be formed of polysilicon. The three-layer feature, which in the illustrated embodiment comprises the first oxide layer 18, the silicon nitride layer 20, and the second oxide layer 22, may be referred to as a charge-trapping structure or, as presently illustrated, an oxide-nitride-oxide (ONO) layer. The ONO layer in the present embodiment is illustrated in the diagram with a left data region 26 and a right data region 28. In modified embodiments of the present invention, fewer or greater data regions may be used.

Figure 2A:
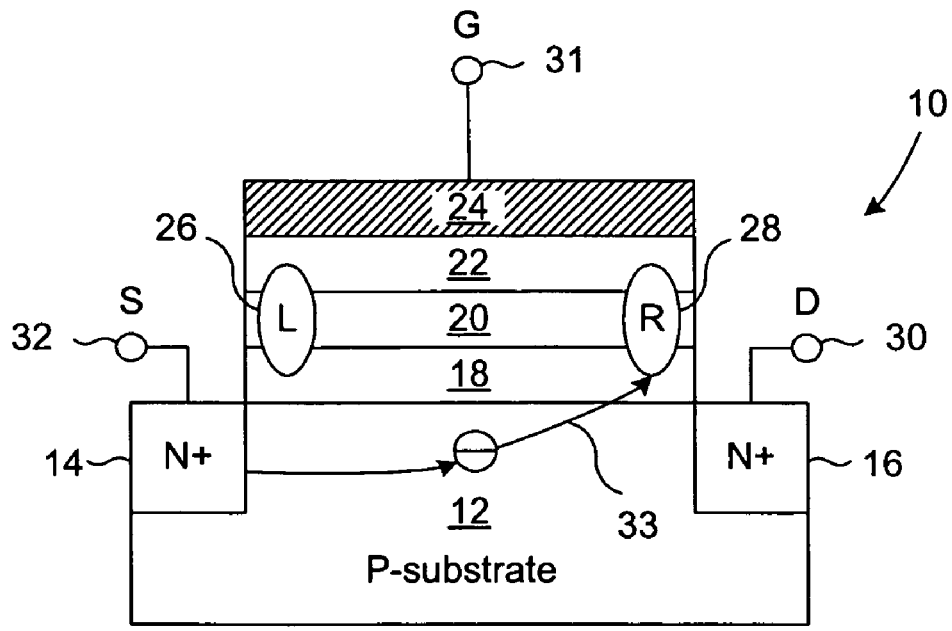
FIG. 2A is a cross-sectional diagram of a nitride read-only memory cell illustrating programming by channel hot electron injection.

Terminals normally are connected to the drain, source, and gate of the embodiment illustrated in FIG. 1. As illustrated in FIG. 2A, a drain terminal 30 may be connected to the drain 16. A gate terminal 31 further may be connected to the gate 24, and a source terminal 32 further may be connected to the source 14. When suitable potentials are applied to the drain terminal 30, the gate terminal 31, and the source terminal 32, charges may be injected into the ONO layer thereby programming the nitride read-only memory cell. An exemplary mode of operation of the nitride read-only memory cell may be referred to as a Program-to-High, Erase-to-Low mode or, more simply, a High Program (HP) mode. According to the HP mode, a large positive potential (e.g., 10 V) may be applied to the gate terminal 31, the source terminal 32 may be grounded, and a medium positive potential (e.g., 6 V) may be applied to the drain terminal 30. This bias condition establishes a negative electron current 33 in the channel of the nitride read-only memory cell 10 between the source 14 and drain 16. Under the influence of an electric field having transverse and vertical components, some of the electrons in the electron current 33 may be accelerated sufficiently to acquire enough kinetic energy to surmount a potential barrier formed by the first oxide layer 18 and to enter the right data region 28 of the ONO layer. These electrons, which may be referred to as hot electrons, may enter the right data region 28, thereby raising a threshold voltage, $V_t$, associated with the right data region 28. Depending upon the resulting $V_t$ value, the right data region 28 may be said to be programmed using a channel hot electron programming method. Because the nitride read-only memory cell 10 is a symmetrical device, it will be clear to one skilled in the art that the left data region 26 can be programmed in a similar manner by interchanging the roles of the source terminal 32 and the drain terminal 30 in the procedure just described.

The effect of programming a nitride read-only memory cell 10 may be undone by a method of erasing a data region. According to an exemplary erasing method associated with the HP operating mode, and with reference to FIG. 2B, the source terminal 32 may be grounded. A medium positive potential (e.g., 5 V) may be applied to the drain terminal 30, and a medium negative potential (e.g. −5 V) may be applied to the gate terminal 31. Under these bias conditions, a deep depletion region can form around the drain 16 and under the gate 24. Electron-hole pairs may be generated and separated within the depletion region. The electric field established by the gate, drain, and source potentials is such that generated electrons are swept to the drain 16 and the holes are swept to the substrate 12. The negative potential applied to the gate terminal 31 causes the holes, generally, to move toward the gate 24, but the majority of holes do not have sufficient kinetic energy to surmount the barrier of the first oxide layer 18. Some of the holes, however, termed band-to-band hot holes 34, are accelerated from the depletion region with sufficient kinetic energy that they are able to surmount the barrier formed by the first oxide layer 18. These hot holes 34 may reach the right data region 28 in the ONO layer and become trapped. These trapped holes can act to neutralize the effect of electrons in the right data region 28. Alternatively, the trapped holes may recombine with electrons in the right data region 28. In either case, the threshold voltage, $V_t$, associated with the right data region 28 is reduced by the injection of holes into the right data region 28. According to an illustrative mode of operation, a data region having a sufficiently low threshold voltage, $V_t$, is said to be erased. Again, the symmetrical structure of the nitride read-only memory cell 10 makes it possible to erase the left data region 26 using a method similar to the one just described by interchanging the roles of the source terminal 32, and the drain terminal 30, in the procedure just outlined.

Depending upon the number of distinguishable $V_t$ values that can be programmed into a data region of a nitride read-only memory cell, the nitride read-only memory cell can store various amounts of data. Generally, the amount of data that can be stored in a data region is measured in bits and is defined as the logarithm to the base 2 of the number of distinguishable $V_t$ values that can be programmed (or erased) into the data region. For example, if a data region can be programmed (or erased) to one of two distinguishable $V_t$ values, then the data region can store $\log_2(2)=1$ bit of information. If a data region can be programmed (or erased) to one of four distinguishable $V_t$ values, then the data region can store $\log_2(4)=2$ bits of information. Similarly, a data region can store $\log_2(8)=3$ bits of information if 8 values of $V_t$ are distinguishable, $\log_2(16)=4$ bits if 16 values of $V_t$ are distinguishable, and so on.

Figure 3:
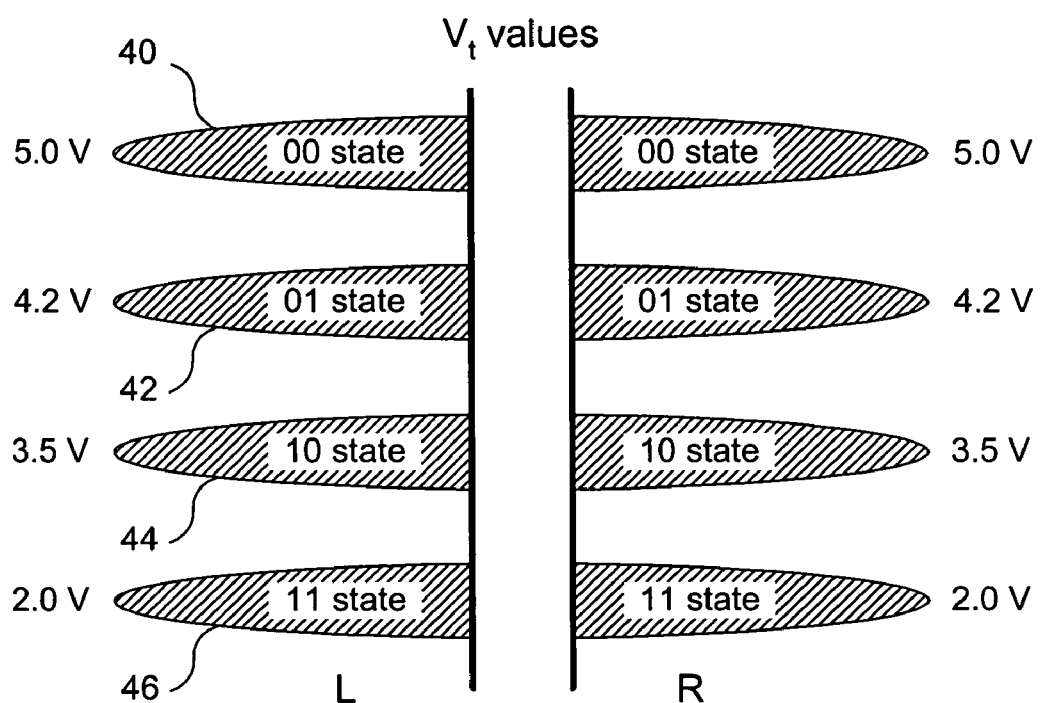
FIG. 3 is a chart representing a nitride read-only memory cell capable of storing four bits of information.

FIG. 3 is a chart that represents a nitride read-only memory cell (e.g., nitride read-only memory cell 10 as illustrated in FIG. 1) capable of storing four bits of information. That is, two bits can be stored in the left data region (L), and two more bits can be stored in the right data region (R), each data region being capable of distinguishing among four $V_t$ values. One way of encoding data stored in a data region is to associate the data with a state of the data region and then to associate a distribution of $V_t$ values with the state. The nitride read-only memory cell depicted in FIG. 3 supports four such states in each data region, the four states being identified as a '00' state associated with a distribution 40 of $V_t$ values corresponding to a program verify (PV) level of 5.0 V, a '01' state associated with a distribution 42 of $V_t$ values having a PV level of 4.2 V, a '10' state associated with a distribution 44 of $V_t$ values having PV=3.5 V, and a '11' state that may be referred, to as the "erased state" associated with a distribution 46 of $V_t$, values having PV=2.0 V). The program verify (PV) terminology refers to an exemplary method of programming a nitride read-only memory cell. When operated in the HP mode, a data region may first be erased to a low $V_t$ condition. A sequence of programming voltage pulses may then be applied to the terminals of the nitride read-only memory cell in order to elevate the $V_t$ associated with a data region to a relatively higher level. Each programming voltage pulse may be followed by a read operation that estimates the value of $V_t$ associated with the data region being programmed. When the read operation verifies that the $V_t$ value exceeds the PV level (in the HP mode), then the data region is said to be programmed.

Figure 4A:
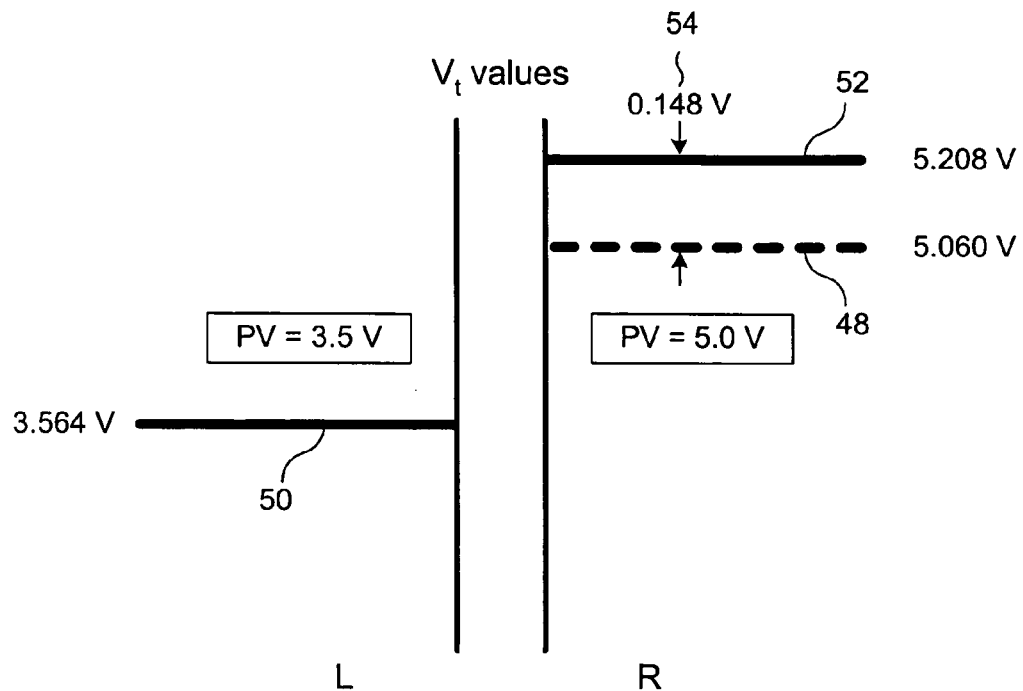
FIGS. 4A, 4B, 5A, 5B, 6A and 6B are symbolic diagrams that depict experimental results of applying programming techniques that employ the channel hot electron method.
Figure 4B:
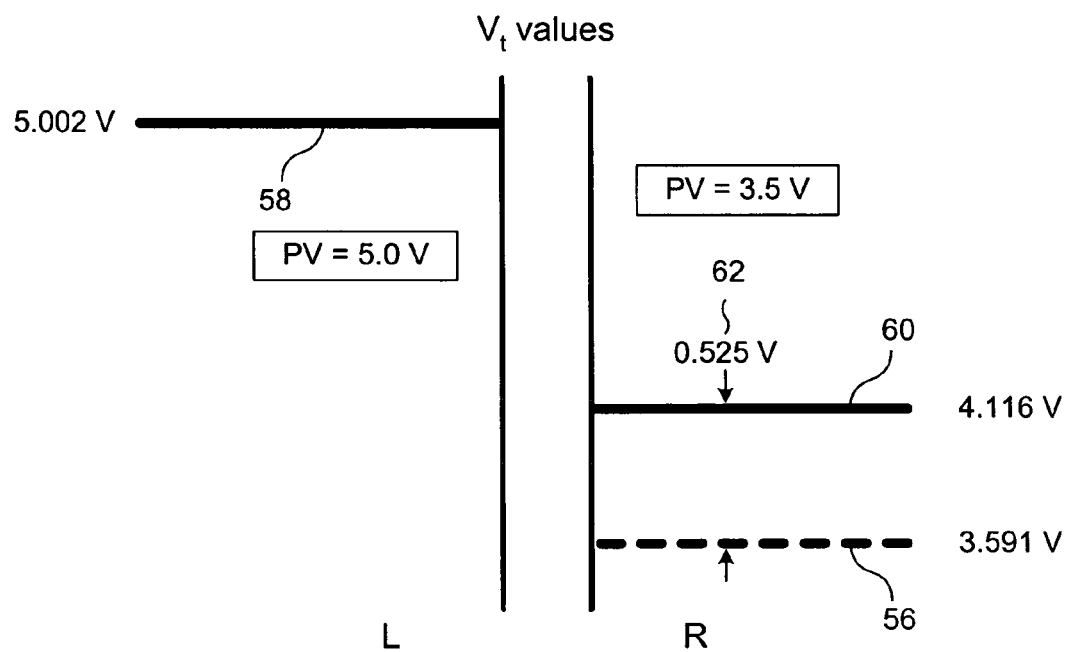

FIGS. 4A and 4B depict two alternative techniques that employ the channel hot electron programming method discussed supra for nitride read-only memory devices operated in the HP mode. The examples illustrated in FIGS. 4A and 4B present experimental data obtained from measurements made on a nitride read-only memory cell of the type illustrated in FIG. 1. Unless stated otherwise, the association between states and $V_t$ values shown in FIG. 3 are used in all the examples that follow. In the example illustrated in FIGS. 4A and 4B, the left data region (L) is to be programmed to the '10' state for which PV=3.5 V, and the right data region (R) is to be programmed to the '00' state for which PV=5.0 V.

According to a preferred method of the present invention, a nitride read-only memory cell may comprise two data regions to be programmed. When a larger $V_t$ value is to be programmed into one data region when compared to the $V_t$ value that is to be programmed into another data region, then the data region that is to be programmed to the larger $V_t$ value is programmed first in time. In the present example, the right data region (R) therefore is programmed first to a $V_t$ value 48 of 5.060 V. The left data region (L) is programmed next to a $V_t$ value 50 of 3.564 V. Experimentally, it has been observed that programming the left data region (L) causes the $V_t$ value associated with the right data region (R) to change to a new $V_t$ value 52 of 5.208 V, because of the second-bit effect. The difference 54 between the original $V_t$ value 48 and the final $V_t$ value 52 for the right data region (R) is 5.208−5.060=0.148 V.

In contrast to the case illustrated in FIG. 4A, FIG. 4B illustrates a result of first programming the data region that is to be programmed to a smaller $V_t$ value of the values to be programmed. In this case the right data region (R) is to be programmed to the '10' state for which PV=3.5 V, and the left data region (L) is to be programmed to the '00' state for which PV=5.0 V. Programming the right data region (R) first, the resulting $V_t$ value 56 for the right data region (R) is 3.591 V. Programming the left data value next yields a $V_t$ value 58 of 5.002 V. Programming the left data region (L) further causes the $V_t$ value in the right data region (R) to shift to a new $V_t$ value 60 of 4.116 V, the shift again being caused by the second-bit effect. The difference 62 between the initial $V_t$ value 56 and the final $V_t$ value 60 is 4.116−3.591=0.525 V, a value considerably larger than the difference 54 (FIG. 4A) of 0.148 V that results when the data region that is to be programmed to the larger $V_t$ value is programmed first.

Figure 5A:
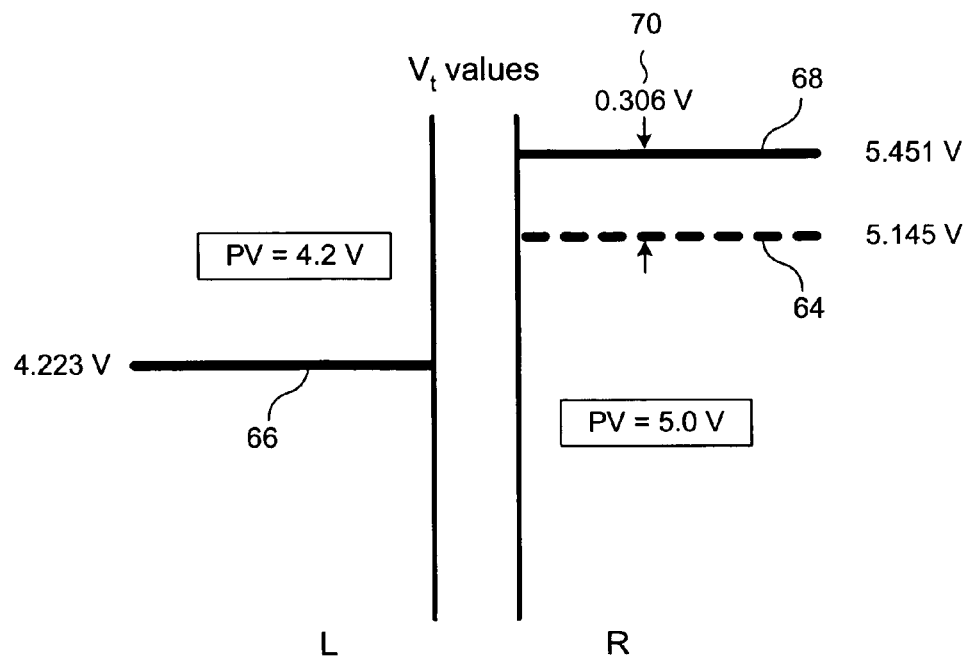
Figure 5B:
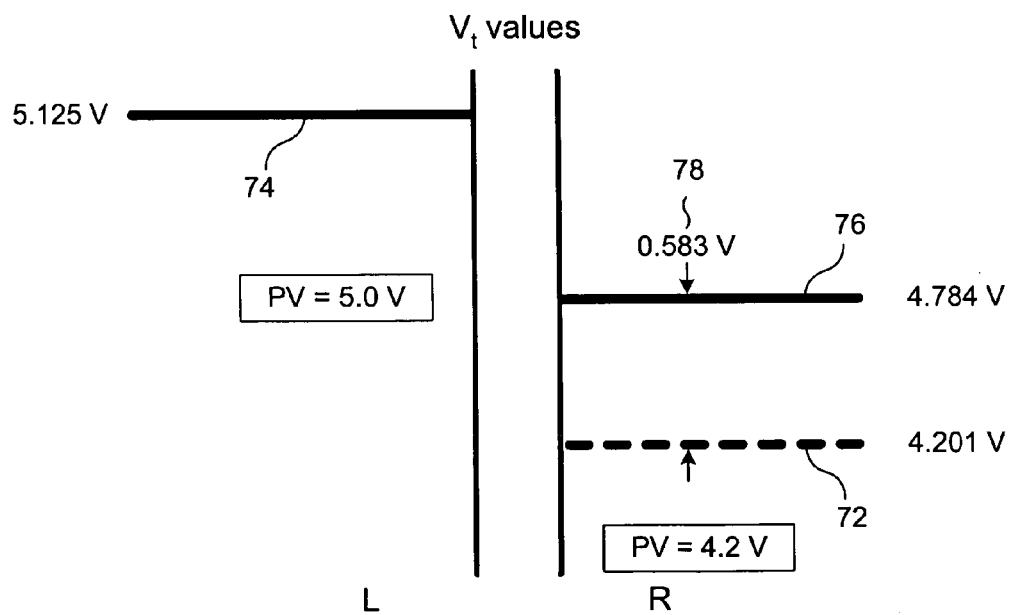

FIGS. 5A and 5B illustrate a similar case that demonstrates that the preferred method of the invention, namely, first programming the data region that is to be programmed to the larger $V_t$ value, results in a smaller second-bit effect than does an alternative method wherein the data region that is to be programmed to the smaller $V_t$ value is programmed first. In the example illustrated in FIG. 5A, the right data region (R) is to be programmed to the '00' state for which PV=5.0 V. The left data region (L) is to be programmed to the '01' state for which PV=4.2 V. Programming the right data region (R) first according to a preferred method of the present invention, the right data region (R) is programmed to a $V_t$ value 64 of 5.145 V. The left data region (L) next is programmed to a $V_t$ value 66 of 4.223 V. Experimental data in this case shows that the $V_t$ value associated with the right data region (R) changes to a new $V_t$ value 68 of 5.451 V because of the second-bit effect. The difference 70 between the initial and final $V_t$ values is 5.451−5.145=0.306 V.

Comparing the case illustrated in FIG. 5A with the result depicted in FIG. 5B where the data region to be programmed with the smaller $V_t$ value is programmed first, the right data region (R) first is programmed to the '01' state for which PV=4.2 V, and the left data region (L) next is programmed to the '00' state for which PV=5.0 V. Programming the right data region (R) results in an initial $V_t$ value 72 of 4.201 V. The left data region (L) then is programmed to $V_t$ value 74 of 5.125 V, which raises the $V_t$ value of the right data region to a new $V_t$ value 76 of 4.784 V, for a difference 78 of 4.784−4.201=0.583 V. Again, the undesirable second-bit effect is observed to be greater when the data region to be programmed with the smaller PV level is programmed first.

Figure 6A:
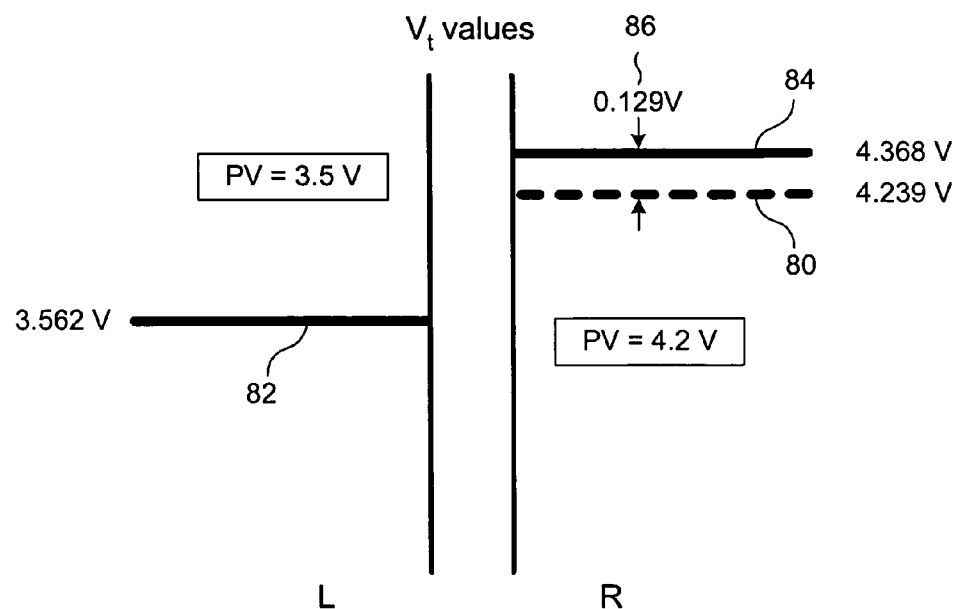
Figure 6B:
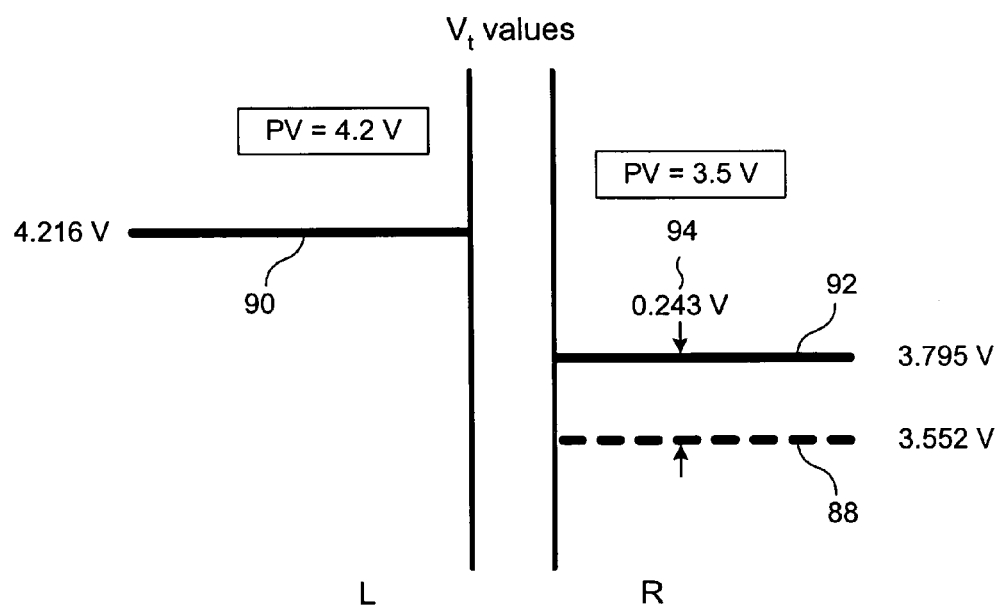

FIGS. 6A and 6B illustrate results of an experiment similar to those described in FIGS. 4A, 4B, 5A, and 5B. Again, an embodiment of the inventive programming method is depicted in FIG. 6A where the right data region (R) is to be programmed to the '01' state for which PV=4.2 V and the left data region (L) is to be programmed to the '10' state for which PV=3.5 V. Programming the right data region (R) first, the initial $V_t$ value 80 is 4.239 V. Next programming the left data region (L) produces a $V_t$ value 82 of 3.562 V. Programming the left data region (L) raises the $V_t$ value for the right data region (R) because of the second-bit effect to a new $V_t$ value of 4.368 V, for a difference 86 of 4.368−4.239=0.129 V.

In contrast, when the data region to be programmed to the lower PV level is programmed first as illustrated in FIG. 6B, the right data region (R) is first programmed to a $V_t$ value 88 of 3.552 V and the left data region (L) is next programmed to a $V_t$ value 90 of 4.216 V. The second-bit effect in this instance raises the $V_t$ value of the right data region (R) to a new value 92 of 3.795 V, for a difference 94 of 3.795−3.552=0.243 V. This difference 94 of 0.243 V is again noted to be significantly larger than the difference 86 of 0.129 V obtained in FIG. 6A where the data region to be programmed with the larger PV level was programmed first.

Figure 2B:
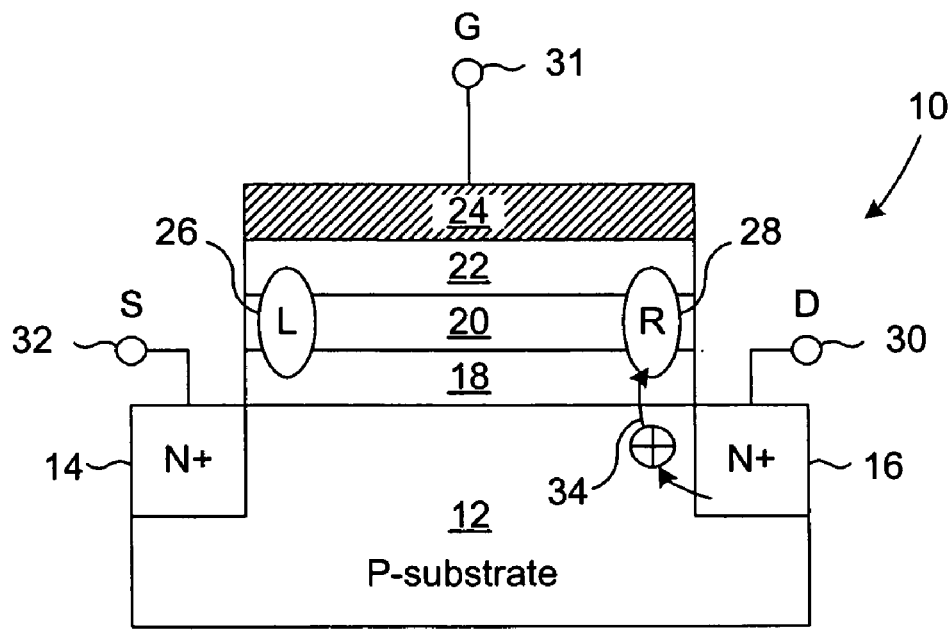
FIG. 2B is a cross-sectional diagram of a nitride read-only memory cell illustrating programming or erasing by band-to-band hot hole injection.

The results depicted in FIGS. 4A–6B pertain to a nitride read-only memory cell operated in the HP mode according to FIG. 2A (i.e., programming to a high $V_t$ value by channel hot electron injection) and FIG. 2B (i.e., erasing to a low $V_t$ value by band-to-band hot hole injection). In these instances, a preferred embodiment of the method of the present invention first programs a data region having a largest associated PV level of the values to be programmed before programming another data region in the same nitride read-only memory cell with which is associated a lower PV level.

Summarizing, when applied to nitride read-only memory cells having an erased state corresponding to a relatively low $V_t$ value, an illustrated method of the invention is first to program a data region in the nitride read-only memory cell to which is assigned the highest PV level. The programming of remaining data regions is performed in time order according to the PV level for each data region, the order being arranged from highest to lowest. In a nitride read-only memory cell having two data regions, a data region having a higher assigned PV level is programmed first in time. The other data region is then programmed.

Figure 7:
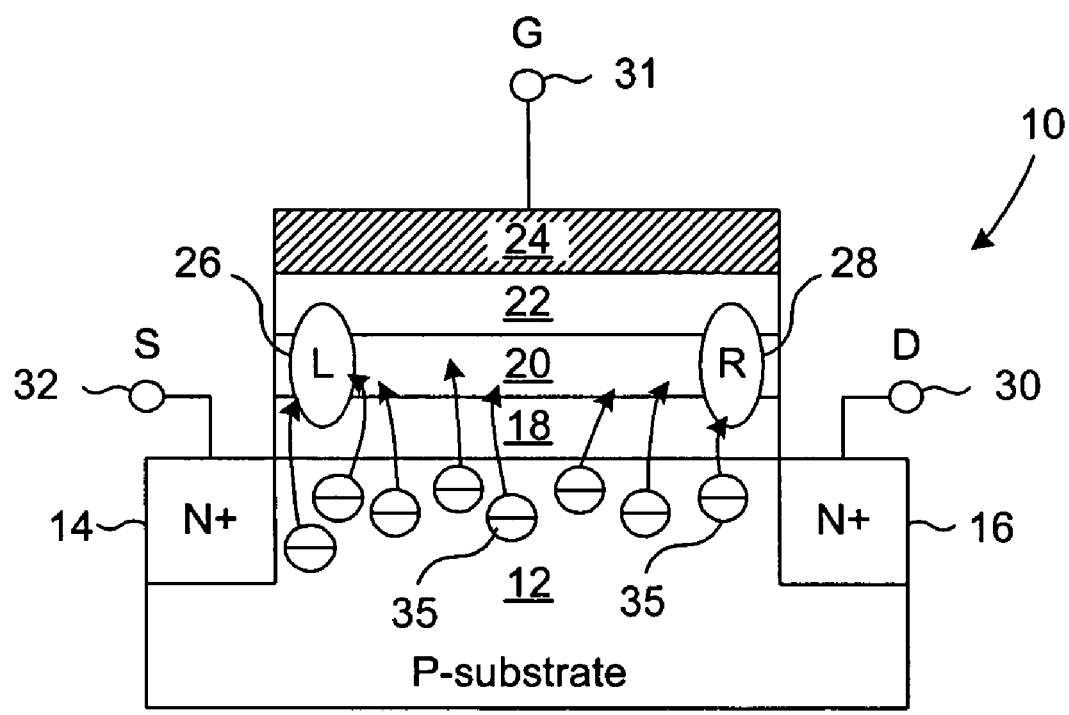
FIG. 7 is a cross-sectional diagram of a nitride read-only memory cell illustrating erasing by Fowler-Nordheim tunneling.

According to another method of the present invention, programming and erasing of the nitride read-only memory cell may be referenced to $V_t$ values such that a data region of the nitride read-only memory cell is programmed to a relatively low $V_t$ value using band-to-band hot hole injection. This operating mode may be referred to as a Program-to-Low, Erase-to-High or, more simply, a Low Program (LP) mode. All data regions of the nitride read-only memory cell operated in the LP mode may be erased to a high $V_t$ value by another method referred to as Fowler-Nordheim (FN) tunneling. FIG. 7 illustrates an aspect of FN tunneling applied to nitride read-only memory cell 10 whereby electrons are injected from the substrate 12 into the ONO layer. FN tunneling may be induced by grounding the source and drain terminals 32 and 30 and applying a large positive voltage (e.g., 18 V in a representative embodiment) to the gate terminal 31 of the nitride read-only memory cell 10. Application of these voltages can cause electrons 35 to move from the substrate 12 and to enter the ONO layer where they may occupy the left data region 26 and the right data region 28. The $V_t$ value for both the left data region 26 and the right data region 28 may thereby be raised to a relatively high level (e.g., 5.0 V), corresponding to an erased state for this mode of operation of the nitride read-only memory cell 10.

When applied to nitride read-only memory cells operated in the LP mode, a preferred method of the invention is first to program a data region in the nitride read-only memory cell that is to have the lowest PV level. The programming of remaining data regions is performed in time order according to the PV level for each data region, the ordering being arranged from lowest to highest.

Figure 8:
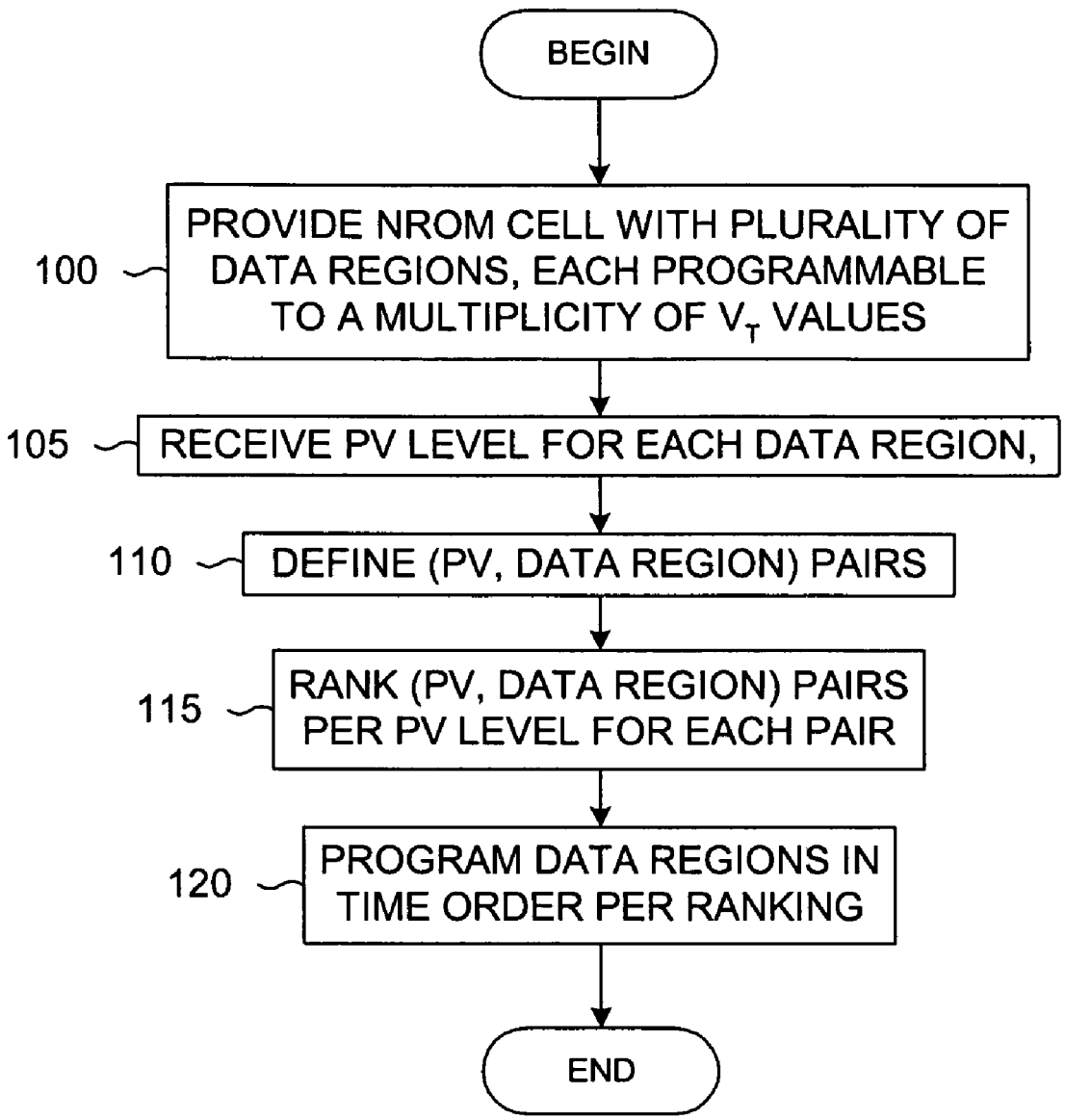
FIG. 8 is a flow diagram that summarizes an embodiment of the method of the present invention.

An embodiment of the method of the present invention is illustrated in FIG. 8. According to this exemplary embodiment, a memory cell, such as a non-volatile charge-trapping memory cell and, as presently embodied, a nitride read-only memory cell (e.g. nitride read-only memory cell 10 as illustrated in FIG. 1) is provided at step 100. The memory cell comprises a plurality of data regions, each being capable of being programmed to one of a plurality of $V_t$ values. In the illustrated embodiment of a nitride read-only memory cell, each of the data regions (e.g. left data region 26 and right data region 28 in FIG. 1) is capable of being programmed to one of a plurality of $V_t$ values. An example of such a plurality of $V_t$ values is illustrated in FIG. 3 wherein four $V_t$ values for each data region are shown. As described herein, PV levels may be associated with the $V_t$ values for the purpose of programming the data regions. Pursuant to the storage of data in the nitride read-only memory cell, a PV level is received or otherwise obtained (e.g., generated) for each data region at step 105. Normally, each PV level is associated with a state (e.g., '00', '01', '10' or '11' as illustrated in FIG. 3) that may be chosen according to received data. For example, referring to FIG. 3, data to be stored may comprise four bits such as 0110 that may be parsed into a state value for each of two data regions. In the present example, a state for left data region (L) may be chosen as '01' according to the first two bits of data to be stored. A state for the right data region (R) may be chosen as '10' according to the last two bits of data to be stored. The diagram of FIG. 3 provides respective received PV levels for the left (L) and right (R) data regions as 4.2 V and 3.5 V. A plurality of ordered associations, or in the illustrated embodiment "pairs" (one for each data region), is then defined at step 110. As an example, the plurality of pairs may be defined as (4.2, L) and (3.5, R) in an illustrated embodiment, wherein, for example, a second element of each ordered pair identifies the data region to be programmed, and a first element of each ordered pair identifies a PV level according to which the identified data region is to be programmed. The ordered pairs created at step 110 then may be ranked in order of the PV level appearing in each pair at step 115. This ranking may place PV levels in order either from largest to smallest or from smallest to largest, depending upon the type of nitride read-only memory cell to which the method is to be applied.

For nitride read-only memory cells that are erased to a low $V_t$ value, i.e., operated in the HP mode, the ordered pairs are ranked at step 115 in order from largest to smallest according to the PV level in the ordered pair. Then the data regions are programmed in time order at step 120 according to the largest to smallest ranking. For nitride read-only memory cells that are erased to a high $V_t$ value, i.e., operated in the LP mode, the ordered pairs are ranked at step 115 in order from smallest to largest according to the PV level in the ordered pair. The data regions are then programmed in time order at step 120 according to smallest to largest ranking.

The method of the present invention has been shown to reduce the second-bit effect and to narrow the $V_t$ distribution associated with program levels of multiple data regions in a nitride read-only memory cell.

In view of the foregoing, it will be understood by those skilled in the art that the methods of the present invention can reduce the spread of a distribution of $V_t$ values associated with states of data regions in nitride read-only memory devices. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method, comprising:
providing a nitride read-only memory cell having a source, a drain, a gate, and a plurality of data regions, each data region being programmable to one of four $V_t$ values;
obtaining a $V_t$ value for each of a plurality of the data regions, thereby defining a collection of ($V_t$, data region) pairs;
ordering a plurality of associations from highest to lowest according to their corresponding $V_t$ values; and
programming at least one of the data regions according to the ranking; and
erasing each of the plurality of data regions by applying potentials to the source, drain, and gate to cause band-to-band hot holes to be injected into the data region, thereby placing the data region into a relatively low $V_t$ condition.

2. The method as set forth in claim 1, wherein the programming of at least one of the data regions comprises applying potentials to the source, drain, and gate to cause channel hot electrons to be injected into the data region.

3. A method, comprising:
providing a nitride read-only memory cell having a source, a drain, a gate, and a plurality of data regions, each data region being programmable to one of four $V_t$ values;
obtaining a $V_t$ value for each of a plurality of the data regions, thereby defining a collection of ($V_t$, data region) pairs;
ordering a plurality of associations from lowest to highest according to their corresponding $V_t$ values; and
programming at least one of the data regions according to the ranking; and
erasing the plurality of data regions by applying potentials to the source, drain, and gate in order to cause electrons to be injected into the plurality of data regions by Fowler-Nordheim tunneling, thereby placing the data region into a high $V_t$ condition.

4. The method as set forth in claim 3, wherein the programming of at least one of the data regions comprises applying potentials to the source, drain, and gate in order to cause band-to-band hot holes to be injected into the data region.

5. A method, comnrising:
providing a non-volatile charge-trapping memory cell having a plurality of data regions, each data region being programmable to one of a plurality of voltage threshold ($V_t$) values;
obtaining a $V_t$ value for each data region, thereby defining a collection of $V_t$ and data region associations;
creating a ranking of the $V_t$ and data region associations according to the $V_t$ value for each association in the collection; and
programming each of the plurality of data regions in a time order according to the ranking.

6. The method as set forth in claim 5, wherein the collection of $V_t$ and data region associations comprises a collection of ($V_t$, data region) pairs.

7. The method as set forth in claim 5, wherein the non-volatile charge-trapping memory cell comprises a nitride read-only memory cell.

8. The method as set forth in claim 5, wherein the providing of a the non-volatile charge-trapping memory cell comprises providing a nitride read-only memory cell having a plurality of data regions, each data region being programmable to one of a plurality of $V_t$ values.

9. The method as set forth in claim 5, wherein the providing of a the non-volatile charge-trapping memory cell comprises providing a nitride read-only memory cell having two data regions, each data region being programmable to one of four $V_t$ values.

10. The method as set forth in claim 5, wherein the creating of a ranking of the $V_t$ and data region associations comprises ordering the $V_t$ and data region associations according to magnitudes of the $V_t$ values of the associations in the collection.

11. The method as set forth in claim 10, further comprising erasing the plurality of data regions.

12. The method as set forth in claim 11, wherein:
the creating of a ranking of the $V_t$ and data region associations comprises ordering the $V_t$ and data region associations from highest to lowest according to $V_t$ values in the collection; and
the providing of a non-volatile charge-trapping memory cell comprises providing a nitride read-only memory cell having a source, a drain, and a gate, and wherein erasing of a data region comprises applying potentials to the source, drain, and gate to cause band-to-band hot holes to be injected into the data region, thereby placing the data region into a relatively low $V_t$ condition.

13. The method as set forth in claim 12, wherein the $V_t$ and data region associations are ordered from highest to lowest according to the $V_t$ values of all of the associations in the collection.

14. The method as set forth in claim 12, wherein programming of a data region comprises applying potentials to the source, drain, and gate to cause channel hot electrons to be injected into the data region.

15. The method as set forth in claim 11, wherein:
the creating of a ranking of the $V_t$ and data region associations comprises ordering the $V_t$ and data region associations from lowest to highest according to $V_t$ values in die collection; and the providing of a non-volatile charge-trapping memory cell comprises providing a nitride read-only memory cell having a source, a drain, and a gate, and wherein erasing of a data region comprises applying potentials to the source, drain, and gate in order to cause electrons to be injected into the plurality of data regions by Fowler-Nordheim tunneling, thereby placing the data region into a relatively high $V_t$ condition.

16. The method as set forth in claim 15, wherein the $V_t$ and data region associations are ordered from lowest to highest according to the $V_t$ values of all of the associations in the collection.

17. The method as set forth in claim 15, wherein programming of a data region comprises applying potentials to the source, drain, and gate in order to cause band-to-band hot holes to be injected into the data region.

* * * * *